(12) United States Patent
Kamata et al.

(10) Patent No.: US 7,333,155 B2
(45) Date of Patent: Feb. 19, 2008

(54) QUADRATIC VIDEO DEMODULATION WITH BASEBAND NYQUIST FILTER

(75) Inventors: Takatsugu Kamata, Yokohama (JP); Kimitake Utsunomiya, Tokyo (JP)

(73) Assignee: RfStream Corporation, Osaka (JP)

( * ) Notice: Subject to any disclaimer, the term of this patent is extended or adjusted under 35 U.S.C. 154(b) by 324 days.

(21) Appl. No.: 10/457,056

(22) Filed: Jun. 5, 2003
(Under 37 CFR 1.47)

(65) Prior Publication Data
US 2004/0095513 A1    May 20, 2004

Related U.S. Application Data

(60) Provisional application No. 60/386,472, filed on Jun. 5, 2002.

(51) Int. Cl.
*H04N 5/455* (2006.01)
*H04N 5/44* (2006.01)

(52) U.S. Cl. .................. 348/726; 348/725; 348/729; 348/731

(58) Field of Classification Search ............. 348/726, 348/725, 729, 731, 732, 733, 570, 21, 738; 455/180.2, 188.1, 188.2, 189.1, 190.1; 333/205, 333/207, 209; 334/87, 89; 375/316, 324, 375/346
See application file for complete search history.

(56) References Cited

U.S. PATENT DOCUMENTS

| | | | |
|---|---|---|---|
| 1,735,742 A | 11/1929 | Fetter | |
| 2,140,770 A | 12/1938 | Scholfield | |
| 2,325,174 A | 7/1943 | Cooper | |
| 2,464,557 A | 3/1949 | Crockett | |
| 2,496,177 A | 1/1950 | Richards et al. | |
| 2,531,312 A | 11/1950 | Loon | |
| 2,549,789 A | 4/1951 | Ferrill | |
| 2,796,524 A | 6/1957 | Ferrill | |
| 2,801,341 A | 7/1957 | Jaffe | |
| 2,815,406 A | 12/1957 | Tongue | |
| 3,252,096 A | 5/1966 | Carlson | |
| 3,400,345 A | 9/1968 | Oloff | |
| 3,488,595 A | 1/1970 | Vasile | |
| 3,509,500 A | 4/1970 | McNair et al. | |
| 3,544,903 A | 12/1970 | Sakamoto | |
| 3,686,575 A | 8/1972 | Chamberlain | |
| 3,794,941 A | 2/1974 | Templin | |

(Continued)

FOREIGN PATENT DOCUMENTS

EP     0392449 A1    10/1990

(Continued)

OTHER PUBLICATIONS

U.S. Appl. No. 11/373,743, filed Mar. 10, 2006, Takatsugu Kamata.

(Continued)

*Primary Examiner*—David Ometz
*Assistant Examiner*—Jean W. Désir
(74) *Attorney, Agent, or Firm*—Stattler-Sub PC

(57) ABSTRACT

A television tuner is fully implemented on a monolithic integrated circuit. The television tuner includes a baseband SAWF function fully integrated in silicon. The SAWF function includes trap and bandpass filters. A video demodulation circuit includes an I, Q demodulation and a post Nyquist filter.

15 Claims, 14 Drawing Sheets

U.S. PATENT DOCUMENTS

| | | | |
|---|---|---|---|
| 3,931,578 A | 1/1976 | Gittinger | |
| 4,112,378 A | 9/1978 | Ito et al. | |
| 4,118,679 A | 10/1978 | Hiday et al. | |
| 4,138,654 A | 2/1979 | Luhowy | |
| 4,296,391 A | 10/1981 | Hazama et al. | |
| 4,330,794 A | 5/1982 | Sherwood | |
| 4,379,271 A | 4/1983 | Lehmann | |
| 4,456,895 A | 6/1984 | Landt et al. | |
| 4,514,763 A | 4/1985 | Rindal | |
| 4,555,809 A | 11/1985 | Carlson | |
| 4,598,423 A | 7/1986 | Hettiger | |
| 4,785,253 A | 11/1988 | Hughes | |
| 4,789,897 A | 12/1988 | Kappeler et al. | |
| 4,812,851 A | 3/1989 | Giubardo | |
| 4,818,903 A | 4/1989 | Kawano | |
| 4,882,614 A | 11/1989 | Kageyama et al. | |
| 4,970,479 A | 11/1990 | Landt et al. | |
| 4,985,769 A | 1/1991 | Yasumoto et al. | |
| 4,988,902 A | 1/1991 | Dingwall | |
| 5,077,542 A | 12/1991 | Lanoiselee | |
| 5,122,868 A | 6/1992 | Isnardi | |
| 5,146,337 A | 9/1992 | Grubbs | |
| 5,146,338 A | 9/1992 | Lehmann et al. | |
| 5,148,280 A | 9/1992 | Wignot et al. | |
| 5,155,580 A | 10/1992 | Gibson et al. | |
| 5,187,445 A | 2/1993 | Jackson | |
| 5,263,018 A * | 11/1993 | Christopher | 370/206 |
| 5,264,937 A * | 11/1993 | Christopher | 348/725 |
| 5,287,180 A * | 2/1994 | White | 348/484 |
| 5,386,239 A | 1/1995 | Wang et al. | |
| 5,491,715 A | 2/1996 | Flaxl | |
| 5,519,265 A | 5/1996 | Latham | |
| 5,525,940 A | 6/1996 | Heikkila et al. | |
| 5,663,773 A | 9/1997 | Goeckler | |
| 5,737,035 A | 4/1998 | Rotzoll | |
| 5,757,035 A | 5/1998 | Terasawa | |
| 5,898,900 A | 4/1999 | Richter et al. | |
| 5,905,398 A | 5/1999 | Todsen et al. | |
| 5,914,633 A | 6/1999 | Comino et al. | |
| 5,917,387 A | 6/1999 | Rice | |
| 5,956,098 A | 9/1999 | Mizukami | |
| 6,016,170 A | 1/2000 | Takayama et al. | |
| 6,094,236 A | 7/2000 | Abe et al. | |
| 6,104,442 A * | 8/2000 | Patel et al. | 348/725 |
| 6,137,773 A * | 10/2000 | Stilwell et al. | 370/209 |
| 6,169,569 B1 | 1/2001 | Widmer et al. | |
| 6,177,964 B1 | 1/2001 | Birleson et al. | |
| 6,219,376 B1 | 4/2001 | Zhodzishsky et al. | |
| 6,226,509 B1 | 5/2001 | Mole et al. | |
| 6,243,567 B1 | 6/2001 | Saito | |
| 6,256,495 B1 | 7/2001 | Francisco et al. | |
| 6,275,113 B1 | 8/2001 | Nakano et al. | |
| 6,307,443 B1 | 10/2001 | Gabara | |
| 6,307,897 B1 * | 10/2001 | Ohta et al. | 375/316 |
| 6,324,233 B1 | 11/2001 | Sempel et al. | |
| 6,351,293 B1 | 2/2002 | Perlow | |
| 6,359,940 B1 | 3/2002 | Ciccarelli et al. | |
| 6,377,315 B1 | 4/2002 | Carr et al. | |
| 6,424,206 B2 | 7/2002 | Takahashi et al. | |
| 6,424,209 B1 | 7/2002 | Gorecki et al. | |
| 6,470,055 B1 | 10/2002 | Feher | |
| 6,535,075 B2 | 3/2003 | Frech et al. | |
| 6,535,722 B1 | 3/2003 | Rosen et al. | |
| 6,538,521 B2 | 3/2003 | Kobayashi et al. | |
| 6,593,828 B1 | 7/2003 | Helfenstein et al. | |
| 6,597,748 B1 | 7/2003 | Hietala et al. | |
| 6,628,728 B1 | 9/2003 | McCarty, Jr. | |
| 6,631,256 B2 | 10/2003 | Suominen | |
| 6,636,085 B2 | 10/2003 | Okazaki et al. | |
| 6,657,678 B1 | 12/2003 | Mizukami et al. | |
| 6,667,649 B1 | 12/2003 | Lee | |
| 6,667,760 B1 * | 12/2003 | Limberg | 348/21 |
| 6,680,971 B1 * | 1/2004 | Tazebay et al. | 375/235 |
| 6,686,817 B2 | 2/2004 | Zhu | |
| 6,714,608 B1 * | 3/2004 | Samueli et al. | 375/344 |
| 6,724,441 B2 * | 4/2004 | Choi | 348/731 |
| 6,725,463 B1 | 4/2004 | Birleson | |
| 6,744,335 B2 | 6/2004 | Ryhanen et al. | |
| 6,750,734 B2 | 6/2004 | Utsunomiya et al. | |
| 6,778,022 B1 | 8/2004 | Zhang et al. | |
| 6,778,594 B1 | 8/2004 | Liu | |
| 6,850,747 B1 | 2/2005 | Imbornone et al. | |
| 6,856,652 B2 * | 2/2005 | West et al. | 375/260 |
| 6,873,369 B2 * | 3/2005 | Koyama | 348/554 |
| 6,882,245 B2 | 4/2005 | Utsunomiya et al. | |
| 6,937,670 B2 * | 8/2005 | Cowley et al. | 375/324 |
| 6,940,358 B1 | 9/2005 | Meacham | |
| 6,940,365 B2 | 9/2005 | Kamata et al. | |
| 7,079,195 B1 * | 7/2006 | Birleson et al. | 348/725 |
| 7,106,388 B2 * | 9/2006 | Vorenkamp et al. | 348/726 |
| 7,116,961 B2 | 10/2006 | Kamata | |
| 7,199,844 B2 | 4/2007 | Utsunomiya | |
| 7,239,357 B2 * | 7/2007 | Jaffe | 348/726 |
| 2002/0047942 A1 | 4/2002 | Vorenkamp | |
| 2002/0050861 A1 | 5/2002 | Nguyen et al. | |
| 2002/0186099 A1 | 12/2002 | Sengupta | |
| 2003/0053562 A1 | 3/2003 | Busson et al. | |
| 2003/0097601 A1 | 5/2003 | Glas et al. | |
| 2003/0132455 A1 | 7/2003 | Utsunomiya | |
| 2003/0186671 A1 | 10/2003 | Prodanov et al. | |
| 2003/0197810 A1 | 10/2003 | Jaffe | |
| 2004/0198289 A1 | 10/2004 | Ashkenazi | |
| 2004/0233029 A1 | 11/2004 | Pohl | |
| 2006/0028301 A1 | 2/2006 | Kamata | |
| 2006/0229046 A1 * | 10/2006 | Bult et al. | 455/252.1 |

FOREIGN PATENT DOCUMENTS

| | | |
|---|---|---|
| EP | 0676880 A2 | 10/1995 |
| EP | 0 707 379 A1 | 4/1996 |
| JP | 11122067 A2 | 4/1999 |
| JP | 11122068 A2 | 4/1999 |
| WO | WO 95 22839 A1 | 8/1995 |
| WO | WO/96/39778 | 12/1996 |
| WO | WO 01 06637 A1 | 1/2001 |
| WO | WO 01 28310 A2 | 4/2001 |

OTHER PUBLICATIONS

U.S. Appl. No. 11/373,555, filed Mar. 10, 2006, Takatsugu Kamata.
U.S. Appl. No. 11/372,602, filed Mar. 10, 2006, Takatsugu Kamata.
U.S. Appl. No. 11/700,687, filed Jan. 30, 2007, Utsunomiya.
U.S. Appl. No. 11/700,515, filed Jan. 30, 2007, Utsunomiya.
U.S. Appl. No. 11/700,511, filed Jan. 30, 2007, Utsunomiya.
U.S. Appl. No. 11/732,505, filed Apr. 2, 2007, Utsunomiya.

* cited by examiner

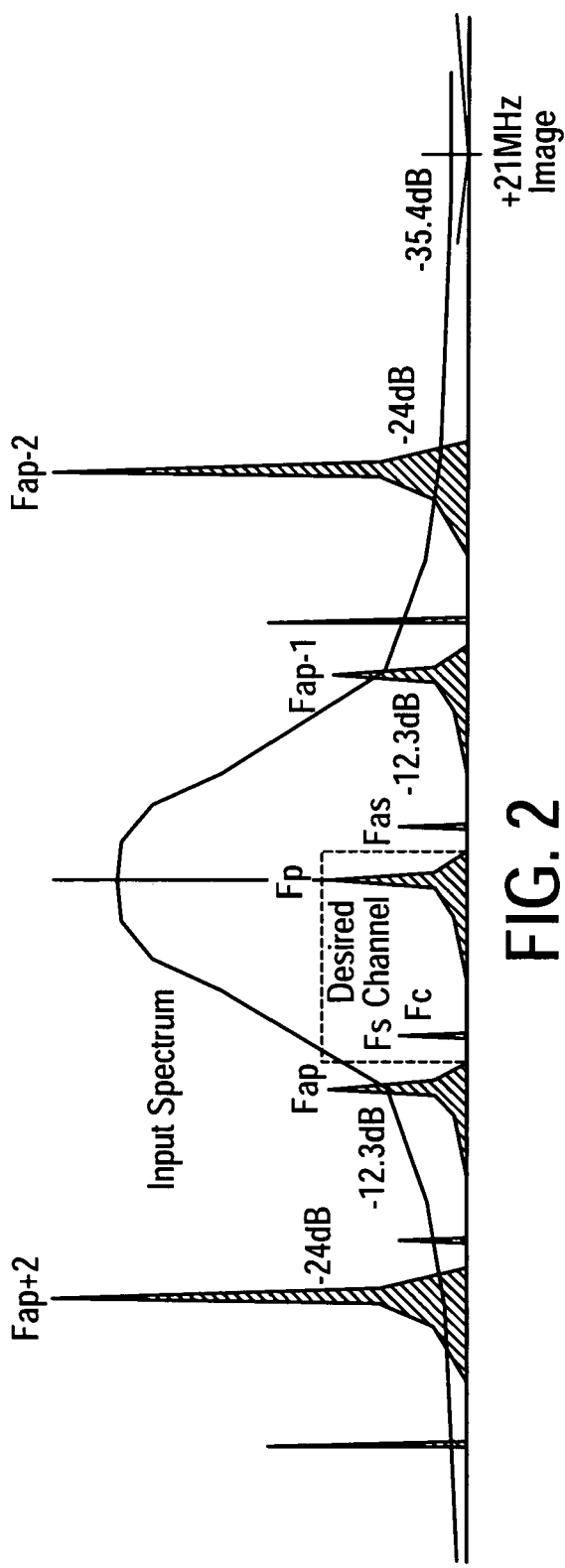
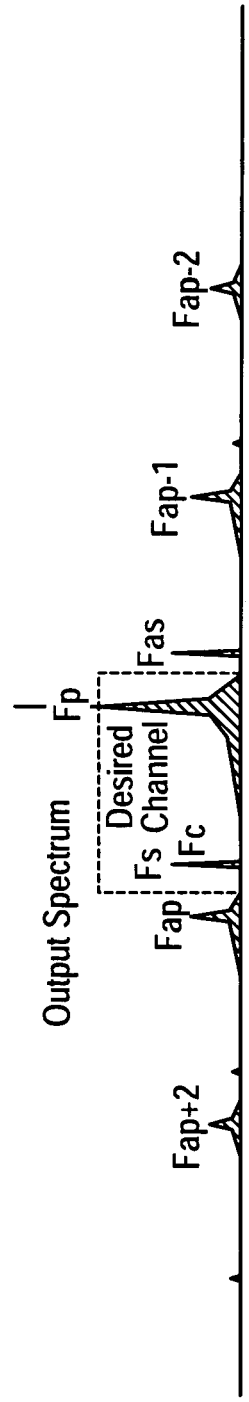
FIG. 2
FIG. 3

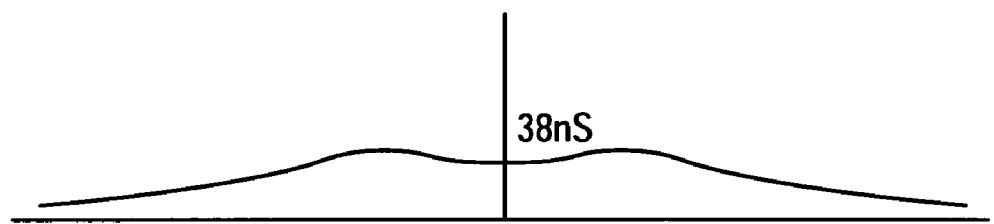
FIG. 4
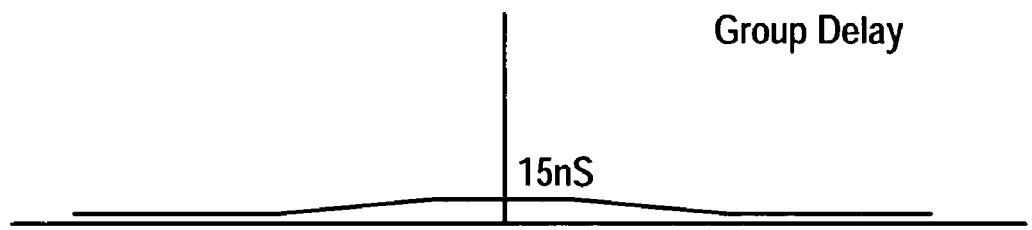
FIG. 7
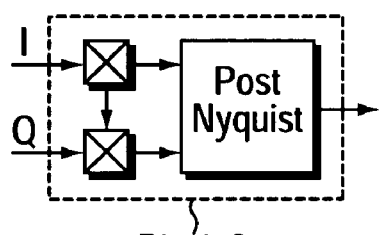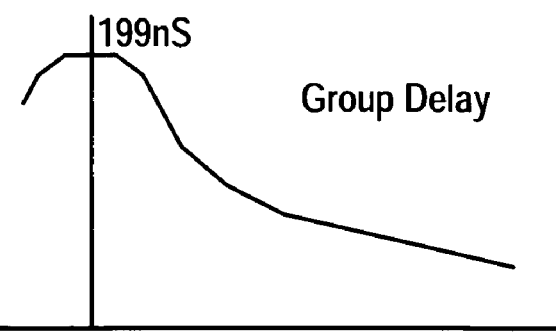
FIG. 13

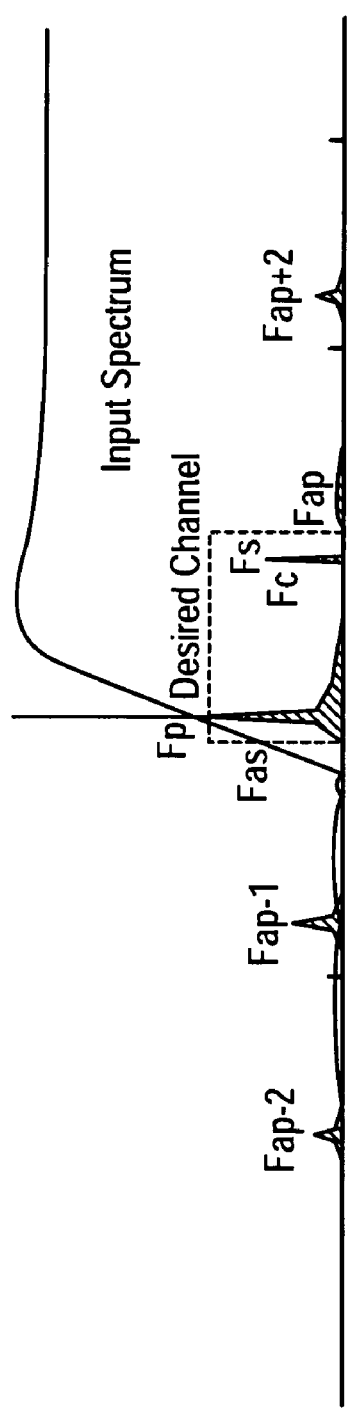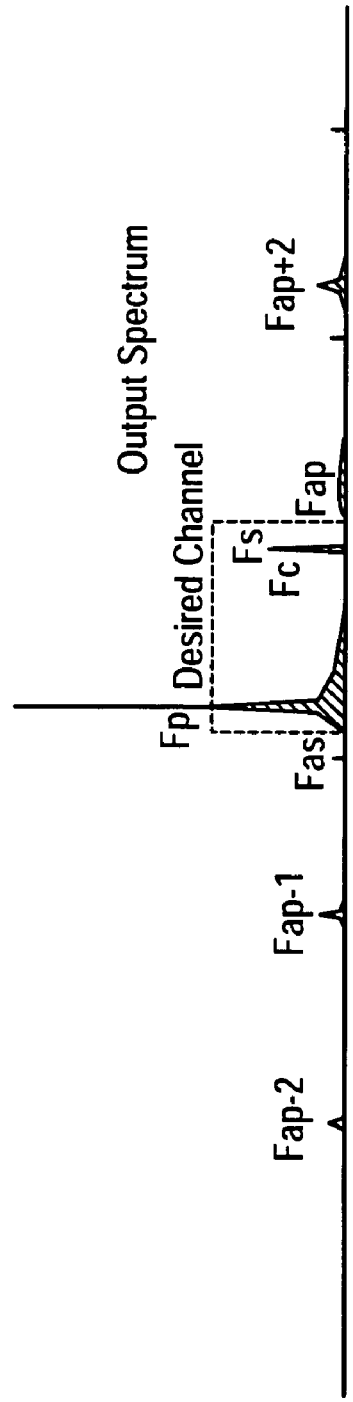

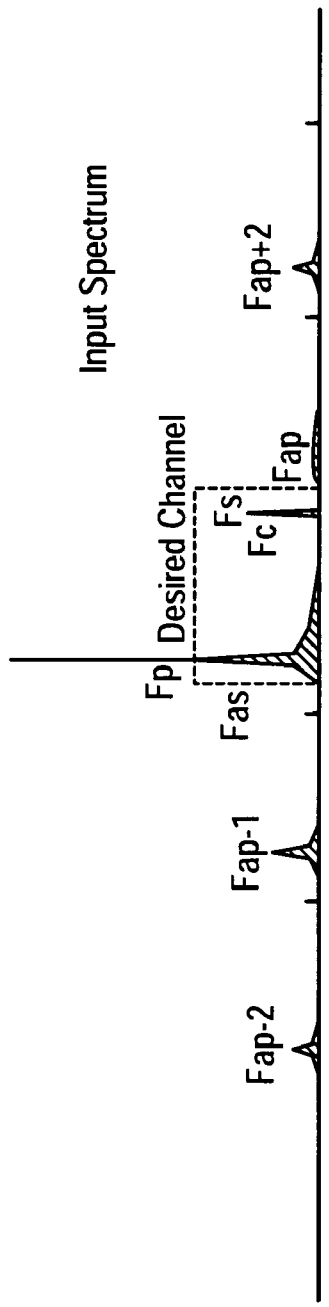
FIG. 14
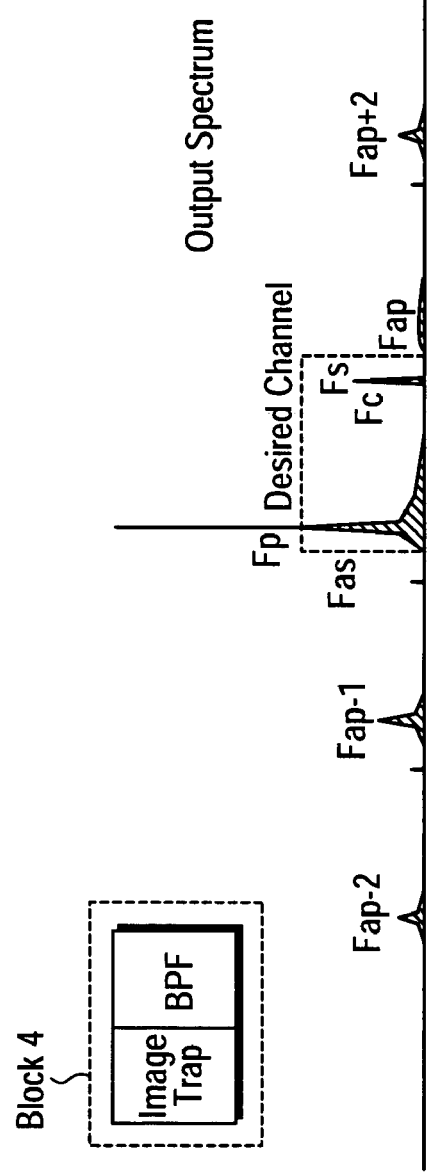
FIG. 15
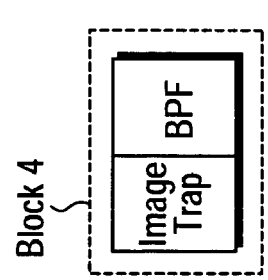

QUADRATIC VIDEO DEMODULATION WITH BASEBAND NYQUIST FILTER

CROSS-REFERENCES TO RELATED APPLICATIONS

This application claims the benefit of U.S. Provisional Patent Application No. 60/386,472, filed Jun. 5, 2002, entitled "A Quadratic Video Demodulation With Baseband Nyquist Filter Using IF Band LC Pre-filter for TV Reception."

BACKGROUND OF THE INVENTION

1. Field of the Invention

The present invention is directed toward the field of receivers, and more particularly toward integrating an entire receiver on a monolithic integrated circuit.

2. Art Background

In general, televisions include circuits to demodulate radio frequency television signals to generate video and sound signals. The video and sound signals provide the information necessary to form the television picture and sound, respectively. An ultrahigh frequency ("UHF")/very high frequency ("VHF") tuner is one type of circuit found in television receivers. In general, the UHF/VHF tuner receives a radio frequency ("RF") television signal that includes a plurality of channels. The channels are modulated on a carrier frequency. The carrier frequency may be in the UHF spectrum or the VHF spectrum. The television is set or tuned to receive a specific channel (e.g., channel 2). The U/V tuner processes the RF television signal based on the channel selected, and generates an intermediate frequency ("IF") signal. In the United States, the intermediate frequency, used in television receivers, is set to a frequency of 45.75 Mhz.

Television receivers also include circuits to perform intermediate frequency processing. These IF television circuits typically employ surface acoustic wave ("SAW") filters. The SAW filter conditions the IF signal prior to demodulation (i.e., prior to extracting the video and audio signals). The SAW filter rejects or suppresses the energy bands associated with channels adjacent to the desired channel (i.e., the selected channel). To this end, the SAW filter provides a Nyquist slope bandpass response for the IF signal.

Typically, Federal Communications Commission regulations mandate receivers operate at higher intermediate frequencies to reduce EMI emissions from the device. Because of this, prior art television receivers operate at intermediate frequencies of 45.75 MHz. The processing of intermediate frequencies at 45.75 MHz mandates use of an external surface acoustic wave ("SAW") filter (i.e., external to the television tuner integrated circuit). If an external SAW filter is used, radiation emanates from the electrical conductors that couple the integrated circuit tuner to the external SAW filter. Because of this emission of radiation, the receiver must comply with the FCC regulation, and the receiver must process the signals at an intermediate frequency of 45.75 MHz.

It is desirable to develop a television receiver that does not require an external SAW filter. It is also desirable to develop a television receiver implemented on a single integrated circuit chip.

SUMMARY OF THE INVENTION

A television tuner is fully implemented on a monolithic integrated circuit. The television tuner includes a baseband SAWF function fully integrated in silicon. The SAWF function includes trap and bandpass filters. A video demodulation circuit includes an I, Q demodulation and a post Nyquist filter.

BRIEF DESCRIPTION OF THE DRAWINGS

FIG. 2 illustrates a frequency spectrum of example IF input signals.

FIG. 3 illustrates an output spectrum showing the attenuation of adjacent channels in the input IF frequency spectrum.

FIG. 4 illustrates an output showing the group delay of the LC bandpass filter.

FIG. 7 illustrates an output showing the group delay of the image rejection notch filter.

FIG. 11 illustrates the frequency characteristics of the signal output from the post Nyquist filter 252.

FIG. 12 illustrates the output frequency spectrum from the I, Q demodulator.

FIG. 13 illustrates an output showing the group delay of the post Nyquist filter 252.

FIG. 14 illustrates an input spectrum to the image trap and bandpass filters 244 and 246.

FIG. 15 illustrates an output spectrum to the image trap and bandpass filters 244 and 246.

DETAILED DESCRIPTION

The disclosure of U.S. Provisional Patent Application No. 60/386,472, filed Jun. 5, 2002, entitled "A Quadratic Video Demodulation With Baseband Nyquist Filter Using IF Band LC Pre-filter for TV Reception" is hereby expressly incorporated herein by reference.

A single monolithic integrated circuit chip fully integrates an entire television receiver. In one embodiment, the monolithic integrated circuit includes an ultra high frequency ("UHF") and a very high frequency ("VHF") tuner integrated with a SAW filter function. In other embodiments, the monolithic integrated circuit further incorporates the intermediate frequency ("IF") processing associated with processing television or other types of signals that possess informational content. In one embodiment, the integrated circuit receiver employs a super heterodyne architecture with either double or triple down conversion. The receiver integrated circuit receives the radio frequency ("RE") as a single input, and in turn, generates, as an output, a composite video baseband signal ("CVBS"), AF out, MPX out.

Figure 1:
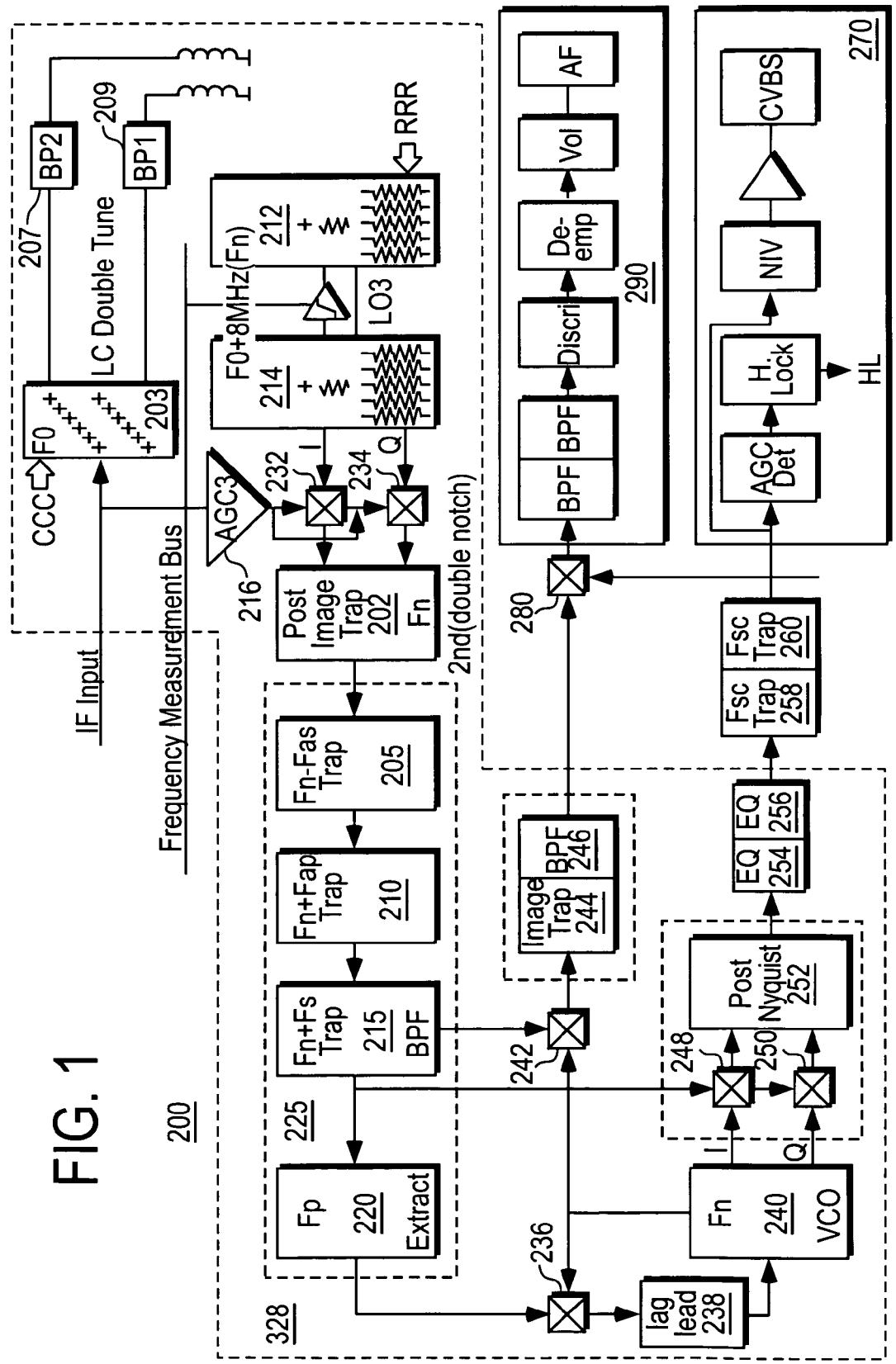
FIG. 1 is a block diagram illustrating one embodiment for processing television signals.

FIG. 1 is a block diagram illustrating one embodiment for processing television signals. Circuit 200 receives, as input, an IF input signal, and generates, as an output, a television audio signal ("AF") and television picture signal ("CVBS"). In one embodiment, the center frequency for the IF input signal is based on a standard for a country. For example, in the United States, the intermediate frequency, used in television receivers, is set to a frequency of 45.75 Mhz.

FIG. 2 illustrates a frequency spectrum of example IF input signals. The spectrum of FIG. 2 shows frequency components for a desired channel, including picture carrier ($F_p$), a sound carrier ($F_S$), and a color sub-carrier ($F_C$). Also, the picture carrier is shown for adjacent channels (i.e., $F_{ap}$, $F_{ap-1}$, $F_{ap-2}$, $F_{ap+2}$). A bandpass filter, consisting of blocks 203, 207 and 209, filters the IF input signal. In one embodiment, the bandpass filter is constructed from a discrete inductor-capacitor ("LC") filter. One embodiment for implementing an LC bandpass filter is described in U.S. patent application Ser. No. 10/273,389, entitled "Methods And Apparatus For Implementing A Receiver On A Monolithic Integrated Circuit", filed Oct. 16, 2002, which is expressly incorporated herein by reference. FIG. 3 illustrates an output spectrum showing the attenuation of adjacent channels in the input IF frequency spectrum. FIG. 4 illustrates an output showing the group delay of the LC bandpass filter.

Figure 5:
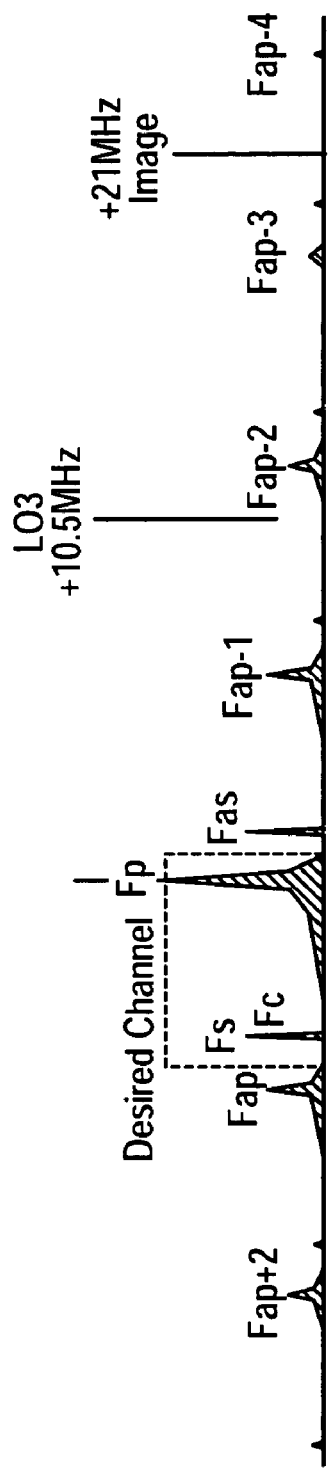
FIG. 5 illustrates the frequency spectrum for the output of the third down conversion circuit at the output of the I,Q demodulator.

The filtered IF signal is input to an automatic gain circuit (AGC 216) for subsequent input to an I, Q demodulator. In general, the I, Q demodulator provides a down conversion from a first intermediate frequency (e.g., 45.75 Mhz) to a second intermediate frequency, Fn (e.g., 10.5 Mhz). In one embodiment, this down conversion is the third conversion in the television tuner (e.g., a first down conversion converts the input RF signal to an RF frequency, a second down conversion converts the RF frequency to a first IF frequency, and the third down conversion converts the first IF frequency to the second IF frequency). The I, Q demodulator includes in-phase ("I") mixer 232, quadrature phase ("Q") mixer 234. The I, Q mixers (232 & 234) receive, at LO ports, signals from a voltage controlled oscillator (212 and 214) and receive, at the RF input, the amplified IF input signal. In turn, the I, Q mixers generate an I, Q mixed signal. FIG. 5 illustrates the frequency spectrum for the output of the third down conversion circuit at the output of the I,Q demodulator. This diagram also shows the local oscillator and image frequency bands for the third down conversion.

Figure 6:
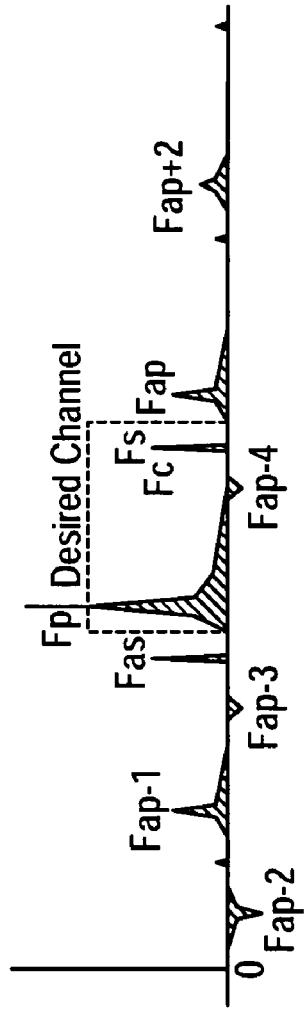
FIG. 6 illustrates the output of the down converted spectrum at the output of the post image trap filter.

The output of the I,Q mixers is input to a post image trap filter 202. An "image signal" is a product of a mixer. The image signal results from mixing an RF signal with a local oscillator signal. For example, an RF input signal with a fundamental frequency of 880 MHz is mixed with a local oscillator having a frequency of 660 MHz to produce a first harmonic at 220 MHz (RF (880 Mhz)–LO (660 Mhz)=220 Mhz). In turn, this first harmonic, centered around 220 MHz, mixes with the local oscillator frequency of 660 MHz to produce the image at 440 MHz. The image frequencies require suppression for proper operation of the circuit. FIG. 6 illustrates the output of the down converted spectrum at the output of the post image trap filter 202. FIG. 7 illustrates an output showing the group delay of the image rejection notch filter.

FIG. 1 also illustrates one embodiment for a Nyquist filter. The Nyquist filter function is implemented using the filters in block 225. For this embodiment, the Nyquist filter 225 receives the output from post image trap filter 202. The output of the Nyquist filter includes all the signals of the desired channel. All the signals of the desired channel are in a 6 MHz band. Specifically, in the United States, the channel bandwidth is fixed at 6 MHz with (1) the picture carrier ($F_P$) located 1.25 MHz from the lower end of the band, (2) a sound carrier ($F_S$) placed 4.5 MHz above the picture carrier frequency, and (2) the color sub-carrier ($F_C$) positioned 3.58 MHz above the picture carrier frequency. The picture carrier is amplitude modulated by a baseband video signal while the sound carrier is frequency modulated. In the description below, the Nyquist filter is initially described for processing NTSC signals. The use of this filter for processing other signal types (e.g., CCIR) is explained after this initial discussion.

The Nyquist filter 225 performs several operations. First, it rejects out of band adjacent channels (e.g., $F_{ap+}$ and $F_{ap-}$) in the signal that it receives. It also extracts the picture signal content (i.e., the signals about the picture carrier $F_P$ and the color sub-carrier $F_C$) and the sound signal content (i.e., the signal about the sound carrier $F_S$).

As shown in FIG. 1, the Nyquist filter includes four filters. Some of these filters are notch (also called trap) filters while others are bandpass filters. In one embodiment, these filters are implemented as biquad filters. Specifically, the Nyquist filter includes trap filters 205 and 210, trap and bandpass filter 215, and bandpass filter 220.

The first two filters, filters 205 and 210, attenuate signals in a limited band. For this embodiment, the notch filter 205 attenuates the frequency component $F_n$–$F_{as}$, and the notch filter 210 attenuates the frequency component $F_n$+$F_{ap}$. The next filter 215 is a bandpass filter and a trap filter. In other words, it receives the output of the second filter (210) and produces two outputs. The first output is a bandpass-filtered version of the second filter's output, while the second output is a notch-filtered version of the second filter's output. The notch filter portion of filter 215 attenuates the frequency component $F_n$-$F_{as}$. The bandpass characteristic of filter 215 is centered around the sound beat frequency, $F_s$. The last filter in block 225, $F_p$ extract 220, is a bandpass filter. The bandpass characteristic of the $F_p$ extract 220 filter is centered around the picture carrier frequency, $F_p$.

Figure 8:
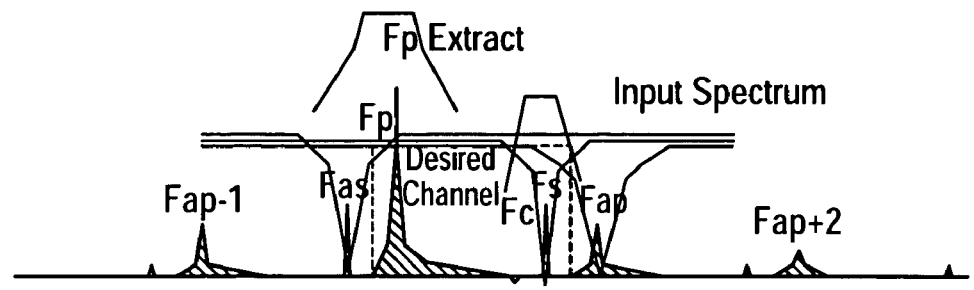
FIG. 8 illustrates a frequency spectrum input to the filter block 225 as well as the frequency response for the filters of block 225.
Figure 9:
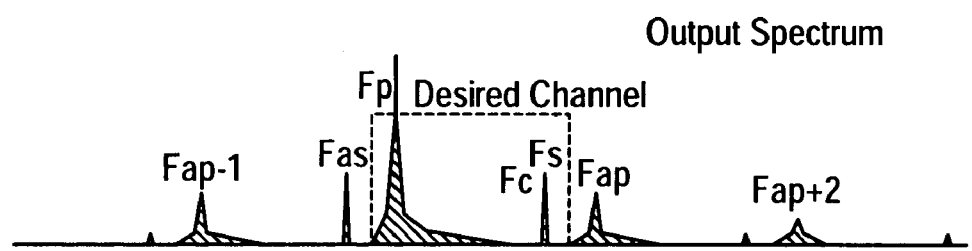
FIG. 9 illustrates a frequency spectrum output from the filter block 225.
Figure 10:
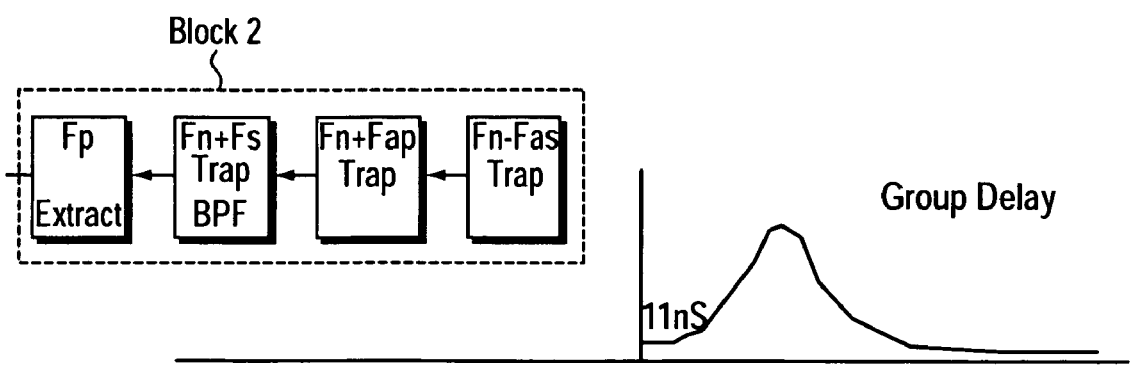
FIG. 10 illustrates an output showing the group delay of the notch filters.

FIG. 8 illustrates a frequency spectrum input to the filter block 225 as well as the frequency response for the filters of block 225. Specifically, FIG. 8 shows the notch or trap frequency responses for the frequencies $F_{ap}$, $F_s$, and $F_{as}$, as well as the bandpass responses for $F_s$, and $F_p$. FIG. 9 illustrates a frequency spectrum output from the filter block 225. FIG. 10 illustrates an output showing the group delay of the notch filters.

The television processing circuit 200 of FIG. 1 includes both picture and sound demodulation. The circuit includes a phase lock loop. The PLL receives the output of the bandpass filter 220. This output includes the picture carrier ($F_P$)

with amplitude modulation. The PLL extracts the amplitude demodulation to obtain the picture carrier signal ($F_P$). As known in the art, the PLL can be formed by a voltage controlled oscillator, a mixer, and a lag-lead circuit. To demodulate the television picture signal, the PLL circuit is used to lock a local oscillator. The signal output from the $F_p$ extract filter 220 is input to mixer 236. A voltage-controlled oscillator ("VCO") generates a signal, at $F_n$ frequency, for input to mixer 236. The mixer 236 generates a phase error between the local oscillator signal and the $F_p$ signal. Specifically, mixer 236 receives the VCO signal and the $F_p$ signal and generates a phase difference. The phase error output from mixer 236 is input to a second order loop filter, lag-lead 238. The lag-lead 238 filters the error signal to adjust the VCO 240.

The television picture processing of circuit 200 further includes I, Q demodulation. The I, Q demodulator removes the high frequency picture carrier signal to obtain the video signal. The local oscillator 240, locked to the Fp signal, generates an in-phase and quadrature phase signals for input to I, Q mixers 248 and 250, respectively. The I, Q mixers down convert the filtered signal (i.e., filtered by notch filters 205, 210 and 215) from the carrier IF frequency $F_n$ to baseband.

The output of the I, Q demodulator (mixers 248 and 250) is input to a post Nyquist filter 252. The post Nyquist filter 252 generates a Nyquist slope used for demodulating the video signal. The Nyquist slope of the video output signal provides a linear attenuation that converts the picture signal from a vestigial sideband signal to one which is equivalent to a single sideband with a carrier. In this manner, the frequency response of the signal after demodulation is flat over the video bandwidth.

FIG. 11 illustrates the frequency characteristics of the signal output from the post Nyquist filter 252. This output signal provides (1) video content of the signal about the picture and the color sub-carrier frequencies, and (2) provides the Nyquist slope. The post Nyqusit filter generates the appropriate Nyquist slope, so as to provide a relatively flat frequency response for the output about the approximate 3.58 MHz bandwidth that contains the picture and the color sub-carrier signals. Thus, the equalizers compensate for group delay introduced by the Nyquist filter. In one embodiment, the circuit uses equalizers 254 and 256. An equalizer shapes the signal within a predetermined band of frequencies. This signal is supplied to the video detector circuit described more fully below. FIG. 12 illustrates the output frequency spectrum from the I, Q demodulator. FIG. 13 illustrates an output showing the group delay of the post Nyquist filter 252.

The output of equalizer 256 is input to filters 258 and 260. The notch or trap filters attenuate the signal at $F_c$ signal for adjacent channels. The video detector circuit 270 performs several functions to extract the video signal. As techniques for performing these operations are known in the art, they will not be described further in order not to obscure the description of the invention with unnecessary detail.

The circuit 200 (FIG. 1) also includes sound demodulation. An IF sound signal is output from the bandpass portion of filter 215. The IF sound signal is first down converted from the $F_n$ carrier frequency using mixer 242. As shown in FIG. 1, mixer 242 receives the phase-locked VCO signal at frequency $F_n$, and down converts the $F_s$ signal. The down converted Fs signal is input to image trap filter 244 and bandpass filter 246. FIG. 14 illustrates an input spectrum to the image trap and bandpass filters 244 and 246. FIG. 15 illustrates an output spectrum to the image trap and bandpass filters 244 and 246. Sound demodulation includes down converting the Fs signal with a 4 MHz signal in mixer 280. The output of mixer 280 is input to audio processing 290. Techniques for performing the audio processing operations shown in block 290 of FIG. 1 are known in the art, and therefore they will not be described further in order not to obscure the description of the invention with unnecessary detail.

Figure 16:
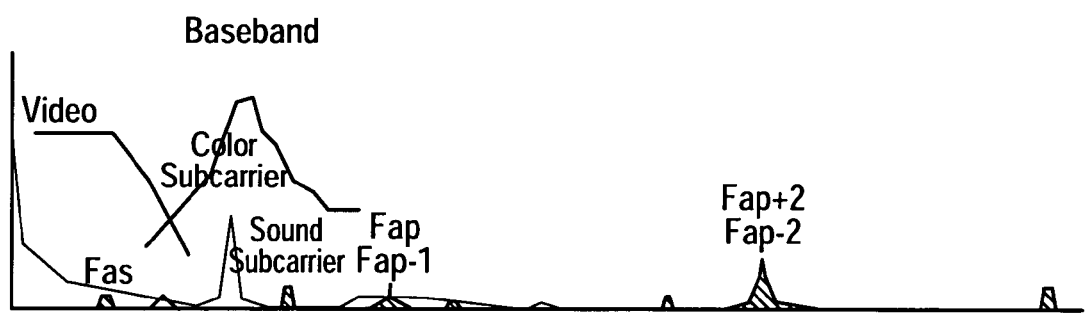
FIG. 16 illustrates a frequency spectrum for the output of the total response.
Figure 17:
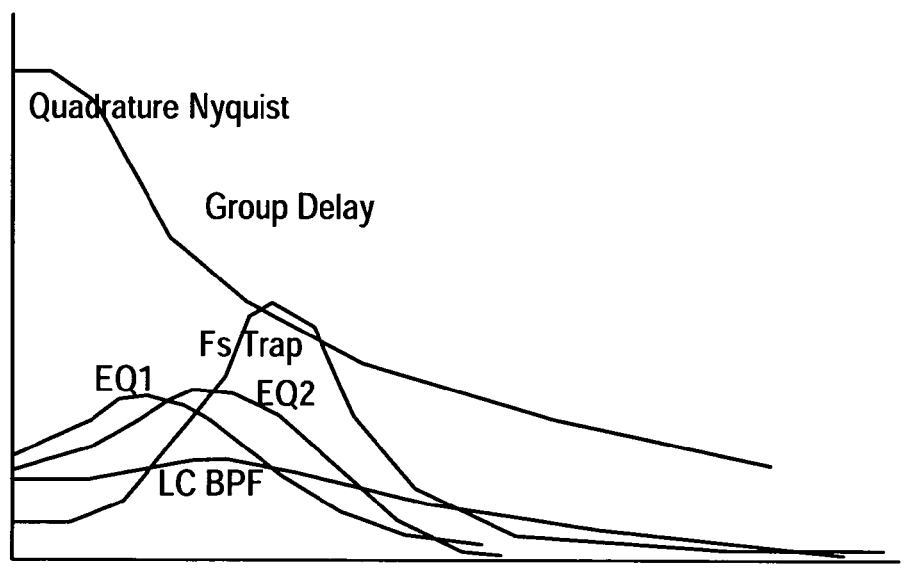
FIG. 17 illustrates the group delay for the output of the total response.

FIG. 16 illustrates a frequency spectrum for the output of the total response. FIG. 17 illustrates the group delay for the output of the total response.

The Nyquist filter may also be used for CCIR signals. Each channel in a CCIR-scheme is 8 MHz. In some embodiments that operate for CCIR signals, the Nyquist filter receives a third downconverter's output that is centered around 13.33 MHz. To adjust the center frequency of the Nyquist filter's biquad filters to be around 13.33 MHz, some embodiments increase the biasing current in each biquad filter by 33.33%. This increase adjusts the $g_m$-value of each filter, which, in turn, adjusts the filter's center frequency.

Also, the intercarrier spacing is different for different countries that use CCIR. The spacing between the picture carrier signal ($F_P$) and the sound carrier signal ($F_S$) is 5.5 in some countries, 6.0 in other countries, and 6.5 in yet other countries. Some embodiments of the invention adaptively modify the filter characteristics to account for these variations in intercarrier signal spacing. Some of these embodiments adaptively modify each filters characteristics by switchably selecting different banks of capacitors as the filters capacitors.

The Nyquist slope filter of the present invention has several advantages over implementing the Nyquist slope in an IF SAW filter. As discussed above in the Background of the Invention section, the SAW filter requires an adjustment in order to track the input frequency with the bandpass characteristics of the SAW filter. In contrast, no tracking or tuning of the Nyquist slope filter is required. In addition, the IF SAW filter implementation introduces group delay in the television signal. No such group delay is introduced through use of the Nyquist slope filter. The SAW filter also generates a large insertion loss for the television signal, between 12-20 dB. Furthermore, the IF SAW filter has a large thermal dependency. The thermal dependency in the SAW filters causes tracking problems for tuning.

Using the Nyquist slope filter of the present invention, no tracking or tuning is required if the I, Q demodulator is phase locked to the input signal. The Nyquist slope filter provides a better Nyquist slope and adjacent channel rejection than the SAW filter implementation. Furthermore, there is no significant signal loss in the Nyquist slope filter. Thus, a 55 dB signal to noise ratio, required to eliminate distortion perceived by a human, is easy to achieve.

Figure 18:
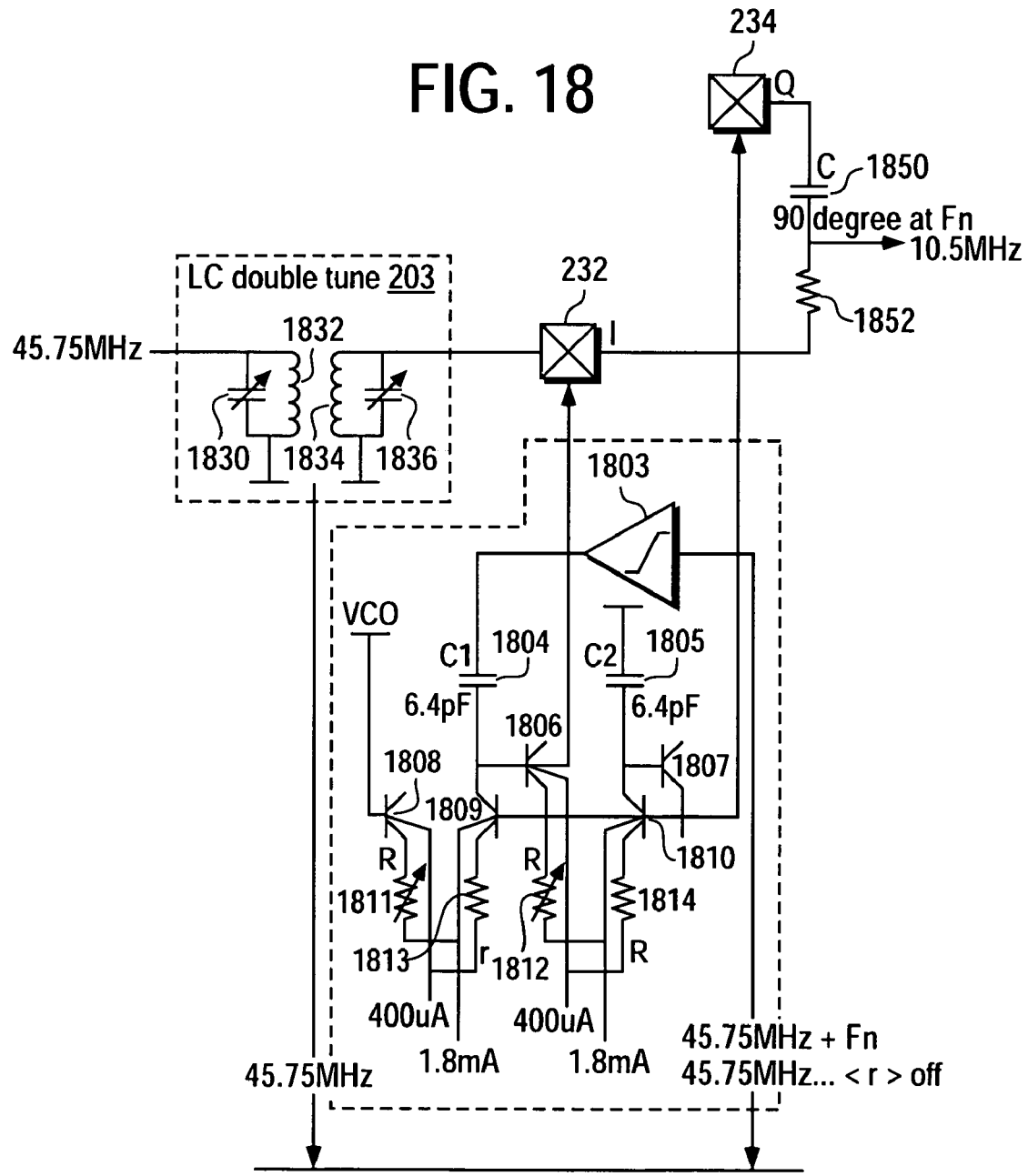
FIG. 18 illustrates one embodiment for an image rejection mixer, including a resistive-capacitive ("RC") filter output.

FIG. 18 illustrates one embodiment for an image rejection mixer, including a resistive-capacitive ("RC") filter output. As shown in FIG. 18, a signal is input to the in-phase ("I") mixer 232 and the quadrature phase ("Q") mixer 234 from the tuneable LC bank filters 203. In one embodiment, each tuneable LC bank filter 203 is comprised of a capacitor bank 1830 and 1836 coupled in parallel to an inductor 1382 and 1834, respectively. Also input to the ("I") mixer 232 and quadrature phase ("Q") mixer 234, at the local oscillator ("LO") port, is a local oscillator signal from the voltage controlled oscillator 212 and 214. The voltage controlled oscillator 212 and 214 outputs an in-phase ("I") signal to the in-phase mixer 232 and a quadrature phase ("Q") signal to the quadrature phase mixer 234.

In some embodiments, the voltage controlled oscillator 212 and 214 is implemented with a transconductance biquadratic filter. For the embodiment shown in FIG. 18, the voltage controlled oscillator 212 and 214 is comprised of a limiter amplifier 1803, capacitors 1804 and 1805, variable resistors 1811 and 1812, resistors 1813 and 1814, and transistors 1806, 1807, 1808, 1809, and 1810. In one embodiment, the transistors comprise bipolar transistors. The emitter of BJT transistors 1808 and 1806 are coupled to a constant current source through variable resistors 1811, and 1812, respectively. In one embodiment, the constant current source generates a current of 1.8 milli-amperes (mA). The 1.8 mA current source is also coupled to the emitter of BJT transistors 1809 and 1810. The emitter of BJT transistors 1809 and 1810 are coupled to a constant current source through resistors 1813 and 1814, respectively. In one embodiment, the constant current source generates a current of 400 micro amperes (uA). The 400 uA current source is also coupled to the emitter of BJT transistors 1806 and 1808. As shown in FIG. 18, the capacitor 1804 is coupled between the limiter amplifier 1803 and the transistors 1806 and 1809 and the capacitor 1805 is coupled to the transistor 1807 and the transistor 1810. In one embodiment, capacitors 1804 and 1805 have a value of 6.4 pica farads (pF) (i.e., C1 and C2=6.4 pF).

As shown in FIG. 18, the I and Q signals are input to the resistor 1852 and capacitor 1850, respectively. In one embodiment, the transfer function includes a real number in the numerator and a complex number in the denominator. The transfer function of the RC filter may be expressed as:

$$A = \frac{1 + j \times S}{1 + S} = \frac{(1 - Z)}{(1 + S)}$$

where, $S = jwCr$ $S = j \times Z = j \times W/Wo$.

Figure 19:
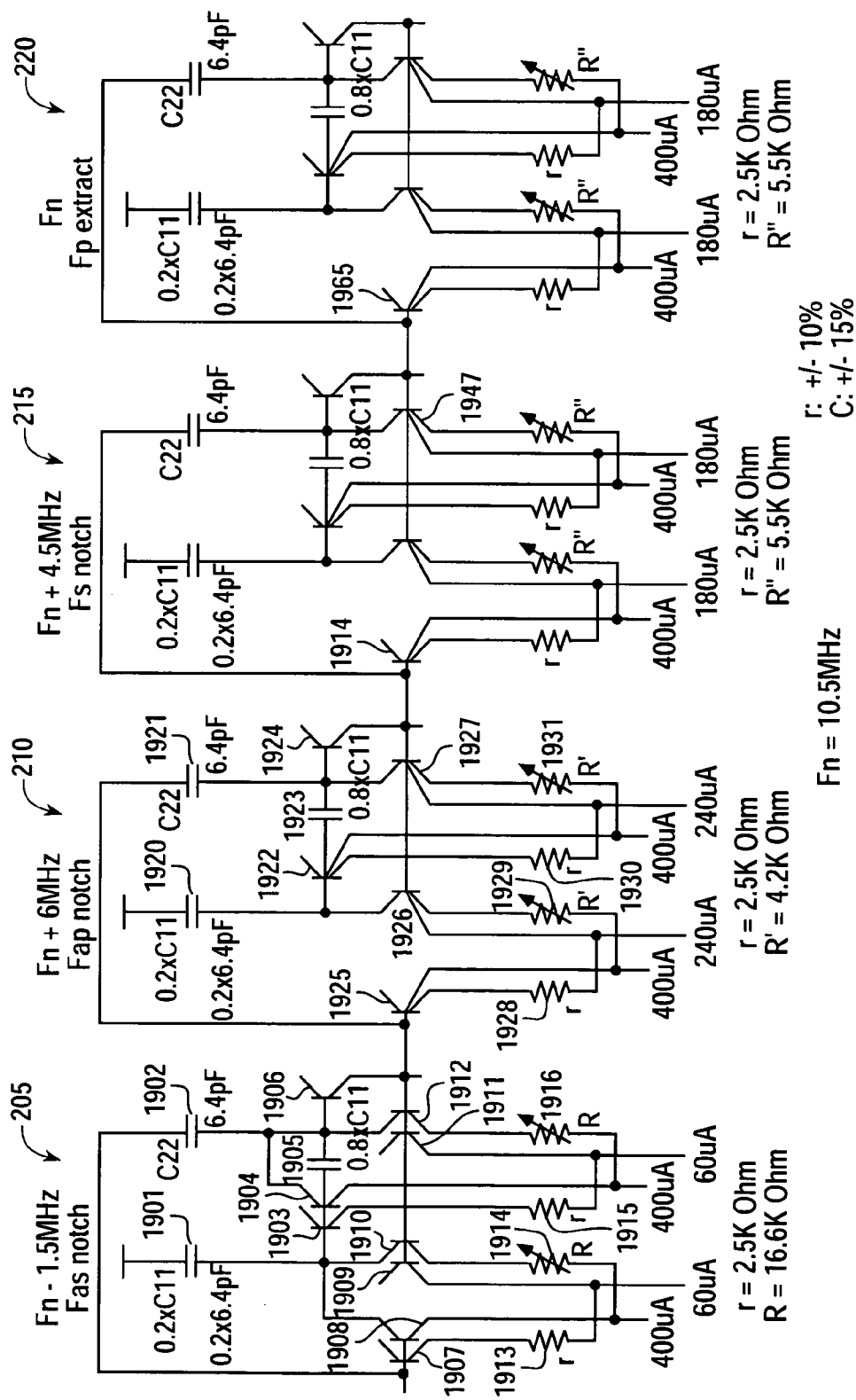
FIG. 19 illustrates one embodiment of the block of cascaded filters 225 used in the present invention.

FIG. 19 illustrates one embodiment of the block of cascaded filters 225 used in the present invention. As shown in FIG. 19, the block of filters 225 is comprised of four RC filters: an Fas filter 205, an Fap filter 210, an Fs filter 215, and an Fp extract filter 220. In some embodiments, each filter 205, 210, 215, and 220 is a biquadratic transconductance filter.

In some embodiments, the Fas filter 205 is a notch filter that attenuates around a center frequency of Fn−1.5 MHz, Fn being the natural or second intermediate frequency. In one embodiment, Fn is equal to 10.5 MHz. For the embodiment shown in FIG. 19, the Fas filter 205 is implemented with capacitors 1901, 1902, and 1905, variable resistors 1914 and 1916, resistors 1913 and 1915, and transistors 1903, 1904, 1906, 1907, 1908, 1909, 1910, 1911, and 1912. In one embodiment, the capacitor 1901 has a value of 0.2×6.4 pF (i.e., C11=6.4 pF), the capacitor 1902 has a value of 6.4 pF (i.e., C22=6.4 pF), and the capacitor 1905 has a value of 0.8×C11 pF. As shown in FIG. 19, the capacitor 1901 is coupled to the transistors 1903, 1908, and 1910, and the capacitor 1902 is coupled to the transistors 1907, 1904, 1906, and 1912 and capacitor 1905. In one embodiment, the variable resistors 1914 and 1916 have a resistance of 16.6 k Ohms and the resistors 1913 and 1915 have a resistance of 2.5 k Ohms.

In one embodiment, the transistors comprise bipolar transistors. As shown in FIG. 19, the emitter of BJT transistors 1910 and 1912 are coupled to a constant current source through variable resistors 1914, and 1916, respectively. In one embodiment, the constant current source generates a current of 400 micro amperes (uA). The 400 uA current source is also coupled to the emitter of BJT transistors 1904 and 1908. The emitter of BJT transistors 1907 and 1903 are coupled to a constant current source through resistors 1913 and 1915, respectively. In one embodiment, the constant current source generates a current of 60 micro amperes (uA). The 60 uA current source is also coupled to the emitters of BJT transistors 1909 and 1911.

In some embodiments, the Fap filter 210 is a notch filter that attenuates around a center frequency of Fn+6 MHz. For the embodiment shown in FIG. 19, the Fap filter 210 is implemented with capacitors 1920, 1921, and 1923, variable resistors 1929 and 1931, resistors 1928 and 1930, and transistors 1922, 1924, 1925, 1926, and 1927. The base of the transistor 1925 of the Fap filter 210 is coupled to the base of the transistor 1912 of the Fas filter 205.

In one embodiment, the capacitor 1920 has a value of 0.2×6.4 pF (i.e., C11=6.4 pF), the capacitor 1921 has a value of 6.4 pF (i.e., C22=6.4 pF), and the capacitor 1923 has a value of 0.8×C11 pF. As shown in FIG. 19, the capacitor 1920 is coupled to the transistors 1922 and 1926, and the capacitor 1921 is coupled to the transistors 1925, 1924, and 1927 and the capacitor 1923. In one embodiment, the variable resistors 1929 and 1931 have a resistance of 4.2 k Ohms and the resistors 1928 and 1930 have a resistance of 2.5 k Ohms.

In one embodiment, the transistors comprise bipolar transistors. As shown in FIG. 19, the emitter of BJT transistors 1926 and 1927 are coupled to a constant current source through variable resistors 1929, and 1931, respectively. In one embodiment, the constant current source generates a current of 400 micro amperes (uA). The 400 uA current source is also coupled to the emitter of BJT transistors 1922 and 1925. The emitter of BJT transistors 1922 and 1925 are coupled to a constant current source through resistors 1930 and 1928, respectively. In one embodiment, the constant current source generates a current of 240 micro amperes (uA). The 240 uA current source is also coupled to the emitter of the BJT transistors 1926 and 1927.

In some embodiments, the Fs filter 215 is a notch filter that attenuates around a center frequency of Fn+4.5 MHz. The base of a transistor 1945 of the Fs filter 215 is coupled to the base of the transistor 1927 of the Fap filter 210. For the embodiment shown in FIG. 19, the Fs filter 215 is implemented in the same manner as the Fap filter 210 with two exceptions: 1) the 240 uA current source of the Fap filter 210 is a 180 uA current source in the Fs filter 215, and 2) the variable resistors having a resistance of 4.2 k Ohms in the Fap filter 210 are variable resistors having a resistance of 5.5 k Ohms in the Fs filter 215. In some embodiments, the Fp filter 220 is a band pass filter that attenuates around a center frequency of Fn. The base of a transistor 1965 of the Fp filter 220 is coupled to the base of a transistor 1947 of the Fs filter 215. For the embodiment shown in FIG. 19, the Fp filter 220 is implemented in the same manner as the Fs filter 215.

Figure 20:
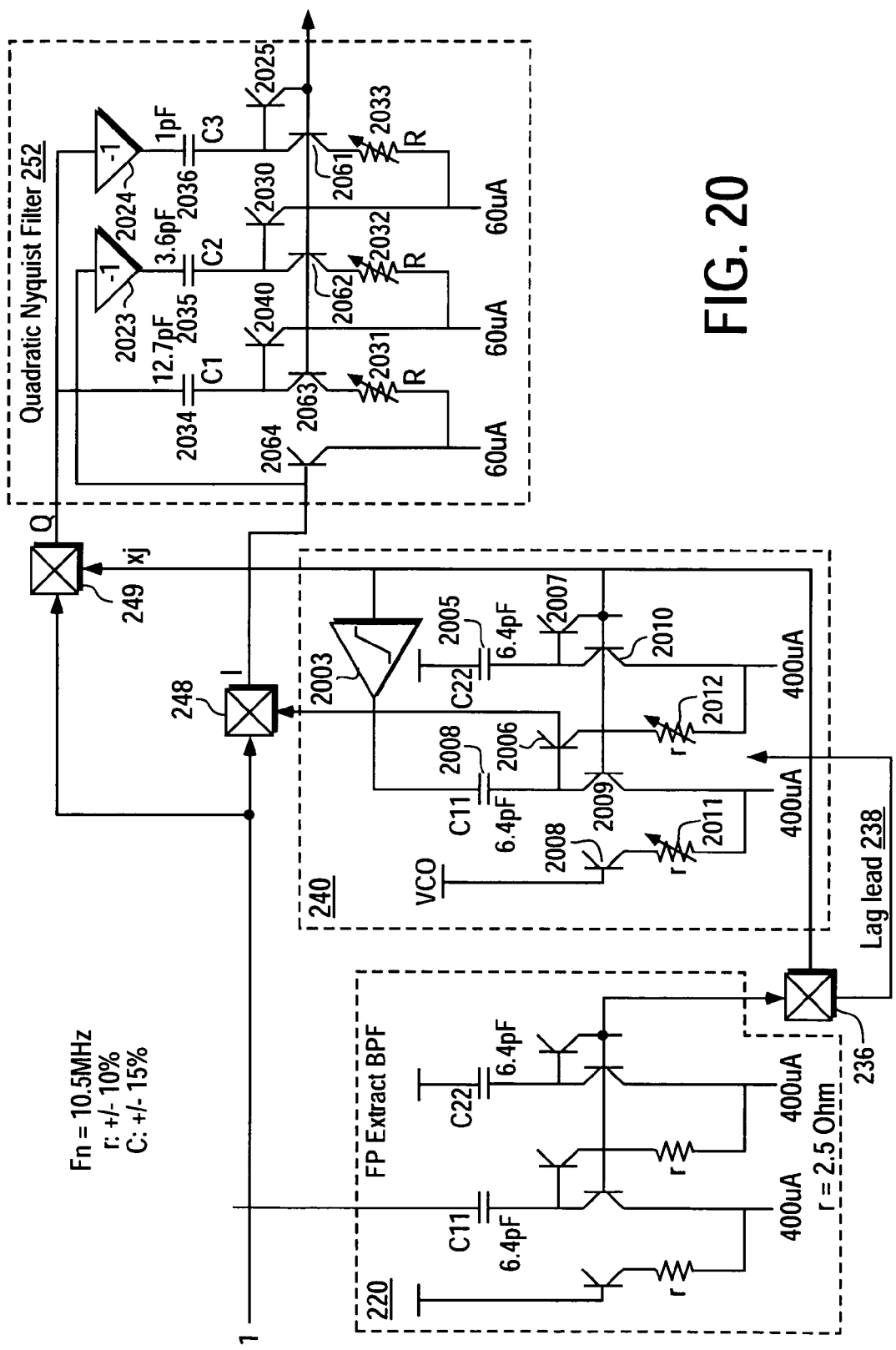
FIG. 20 illustrates embodiments for the voltage controlled oscillator 240 and the quadratic Nyquist slope filter 252 used in the present invention.

FIG. 20 illustrates embodiments for the voltage controlled oscillator 240 and the quadratic Nyquist slope filter 252 used in the present invention.

As shown in FIG. 20, the Fp extract filter 220 sends a signal to the mixer 236 which sends a signal to the lag lead filter 238. In some embodiments, the lag lead filter 238 is a second order phase loop filter. The voltage controlled oscillator 240 receives a signal from the lag lead filter 238 and outputs an in-phase ("I") signal to the in-phase mixer 248, a quadrature phase ("Q") signal to the quadrature phase mixer 249, and a signal to the mixer 236. The Nyquist slope filter 252 receives a signal from the in-phase mixer 248 and a signal from the quadrature phase mixer 249.

For this embodiment, the voltage controlled oscillator 240 is implemented with a limiter amplifier 2003, capacitors 2004 and 2005, variable resistors 2011 and 2012, and transistors 2006, 2007, 2008, 2009, and 2010. In one embodiment, the transistors comprise bipolar transistors. The emitter of BJT transistors 2008 and 2006 are coupled to a constant current source through variable resistors 2011, and 2012, respectively. In one embodiment, the constant current source generates a current of 400 micro amperes (uA). The constant current source is also coupled to the transistors 2009 and 2010. As shown in FIG. 20, the capacitor 2004 is coupled between the limiter amplifier 2003 and the transistors 2006 and 2009, and the capacitor 2005 is coupled to the transistors 2007 and 2010. In one embodiment, capacitors 2004 and 2005 have a value of 6.4 pica farads (pF) (i.e., C11 and C22=6.4 pF).

In one embodiment, the Nyquist slope filter 252 comprises a biquadratic filter. For this embodiment, the Nyquist slope filter 252 includes two inverters (2023 and 2024). The invertors invert in-phase (I) and quadrature phase (Q) signals to generate a negative I and Q signals. The negative I and Q signals, along with the positive I and Q signals, constitute the differential I, Q pair. The differential I, Q pair is input to the quadratic Nyquist slope filter 252.

In the embodiment shown in FIG. 20, the Nyquist slope filter is implemented with capacitors 2034, 2035, and 2036 and variable resistors 2031, 2032, and 2033. A plurality of transistors (2025, 2030, 2040, 2061, 2062, 2063, and 2064) are also used to construct the Nyquist slope filter. In one embodiment, the transistors comprise bipolar transistors. Specifically, the emitter of BJT transistors 2061, 2062, and 2063 are coupled to a constant current source through variable resistors 2033, 2032, and 2031, respectively. In one embodiment, the constant current source generates a current of sixty (60) micro amperes (uA), and the variable resistors are set to a value of 16 kilo ohms. As shown in FIG. 20, capacitor 2034 couples the positive Q input to the base of transistor 2040, capacitor 2035 couples the negative I input to the base of transistor 2030, and capacitor 2036 couples the negative Q input to the base of transistor 2025. In one embodiment, capacitor 2034 has a value of 12.7 pico farads (pF), capacitor 2035 has a value of 3.60 pF, and capacitor 2036 has a value of 1 pF (i.e., C1=12.7 pF, C2=3.6pF, and C3=1pF).

The transfer function for the Nyquist slope filter is expressed in the S domain. The transfer function is at least a second order function. In one embodiment, the transfer function includes a real number in the numerator and a complex number in the denominator. The Nyquist slope filter comprises inverters so that the transfer function includes only terms in the numerator with the same sign. Specifically, the Nyquist slope filter transfer function may be expressed as:

$$A = \frac{1 + jxS1 - S1xS2 - jxS1xS2xS3}{1 + S1 + S1xS2 + S1xS2xS3}$$

wherein, $S1=jwC1R$ $S2=jwC2R$ $S3=jwC3R.$

This denominator may be factored as follows.

$1+S1+S1 \times S2+S1 \times S2 \times S3=(1+Sa) \times (1+Sb) \times (1+Sc)$

Thus, the filter transfer function may also be expressed as:

$$A = \frac{(1+Za)x(1+Zb)x(1+Zc)}{(1+Sa)x(1+Sb)x(1+Sc)}$$

wherein, $$Sa = jxZa = jx\frac{W}{Wa}$$

$$Sb = jxZb = jx\frac{W}{Wb}$$

$$Sc = jxZc = jx\frac{W}{Wc}.$$

Figure 21:
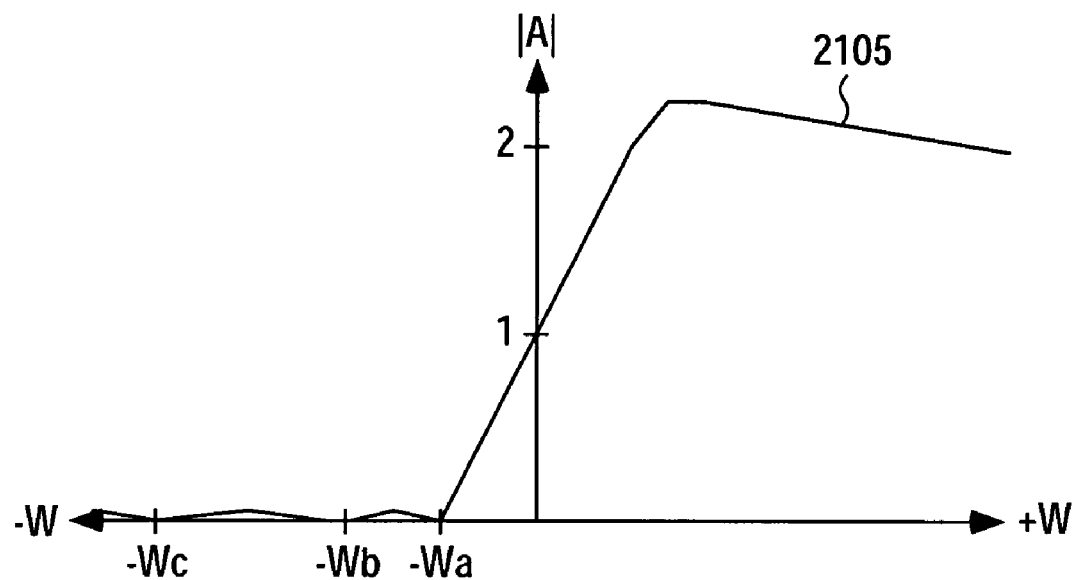
FIG. 21 shows the angular frequency response of the Nyquist slope filter 252 used in the present invention.

FIG. 21 shows the angular frequency response of the Nyquist slope filter 252 used in the present invention. The Nyquist slope frequency response is shown as a curve 2105. For the embodiment shown in FIG. 21, the Nyquist slope filter response includes three zero crossings at −Wa, −Wb, and −Wc. In one embodiment, the Nyquist slope filter includes notch filters to maximize suppression of adjacent channels at these frequencies.

Figure 22:
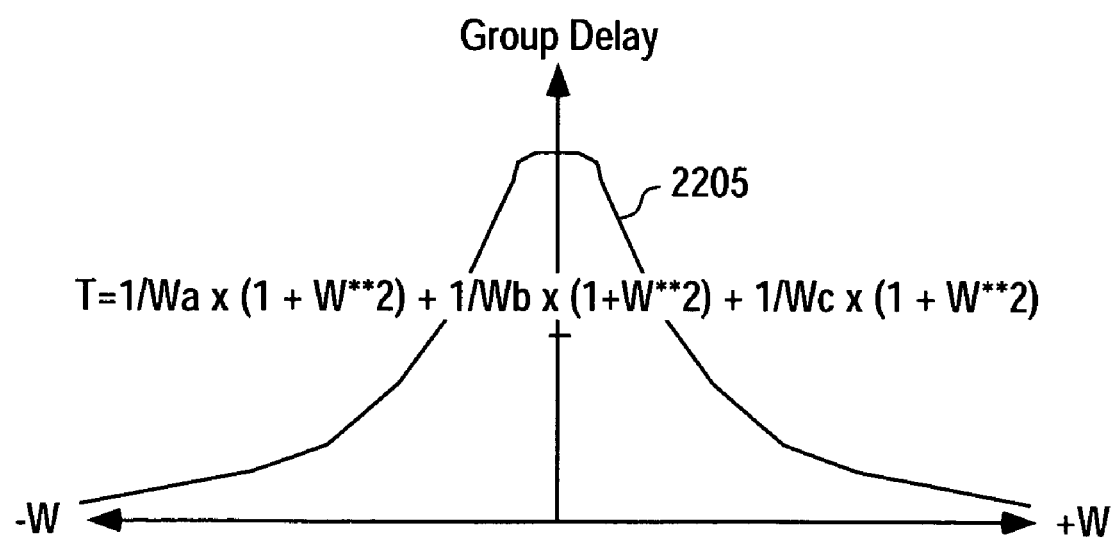
FIG. 22 shows the group delay of the Nyquist slope filter 252 used in the present invention.

FIG. 22 shows the group delay of the Nyquist slope filter 252 used in the present invention. The Nyquist group delay is shown as a curve 2205. For the embodiment shown in FIG. 22, the Nyquist group delay can be expressed by the following equation for time (T):

$$T = \frac{1}{Wa} \times (1+W \wedge 2) + \frac{1}{Wb} \times (1+W \wedge 2) + \frac{1}{Wc} \times (1+W \wedge 2).$$

Figure 23:
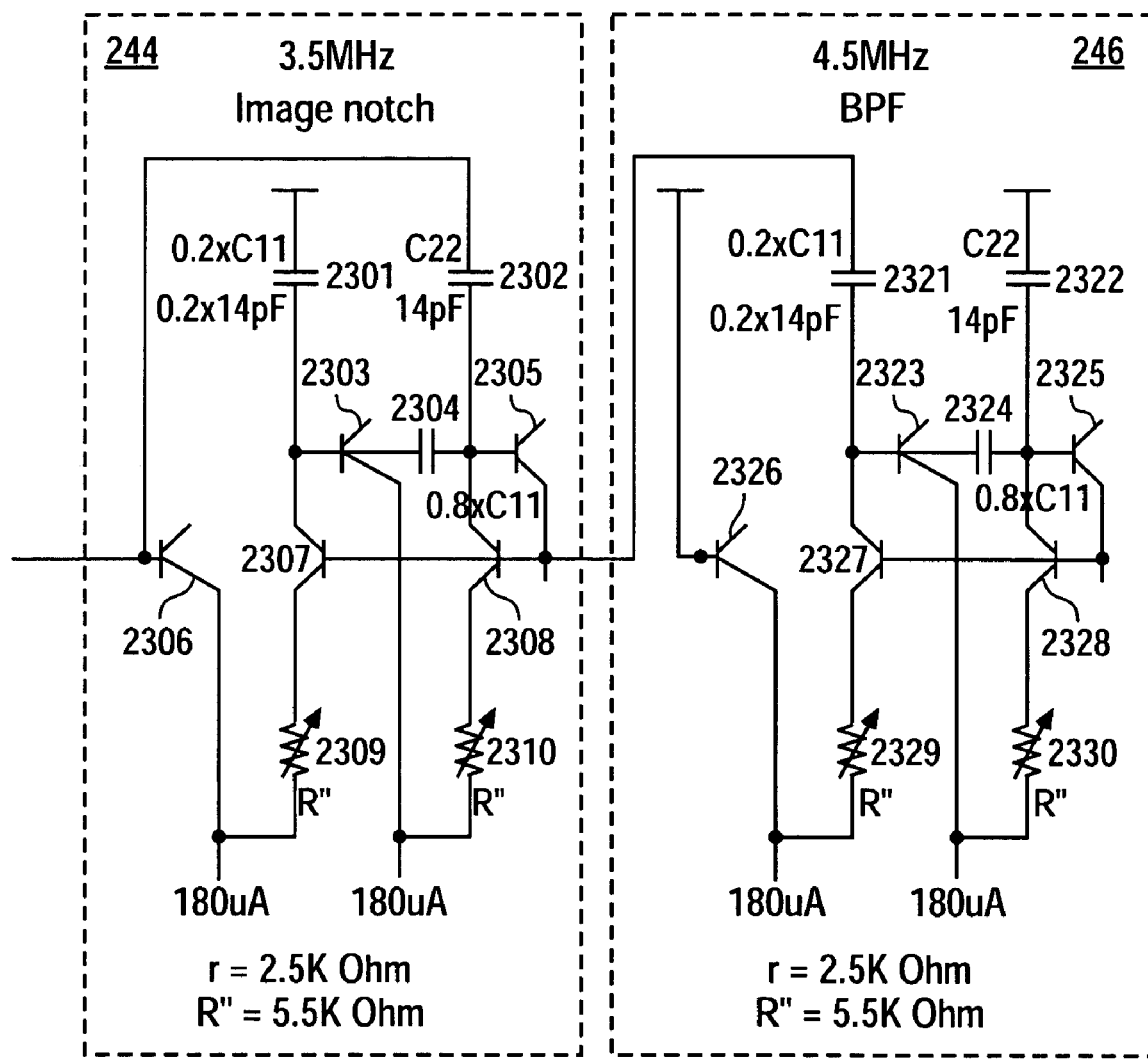
FIG. 23 illustrates one embodiment of the image trap filter 244 and the band pass filter 246 used in the present invention.

FIG. 23 illustrates one embodiment of the image trap filter 244 and the band pass filter 246 (FIG. 1) as used in the present invention. In some embodiments, the image trap filter 244 and the band pass filter 246 are RC biquadratic transconductance filters.

In some embodiments, the image trap filter 244 is a notch filter that attenuates around a center frequency of 3.5 MHz. For the embodiment shown in FIG. 23, the image trap filter 244 is implemented with capacitors 2301, 2302, and 2304, variable resistors 2309 and 2310, and transistors 2303, 2305, 2306, 2307, and 2308. In one embodiment, the capacitor 2301 has a value of 0.2×14 pF (i.e., C11=14 pF), the capacitor 2302 has a value of 14 pF (i.e., C22=14 pF), and the capacitor 2304 has a value of 0.8×C11 pF. As shown in FIG. 23, the capacitor 2301 is coupled to the transistors 2303 and 2307, and the capacitor 2302 is coupled to the transistors 2305 and 2308 and capacitor 2304. In one embodiment, the variable resistors 2309 and 2310 have a resistance of 5.5 k Ohms. In one embodiment, the transistors comprise bipolar transistors. As shown in FIG. 23, the emitter of BJT transistors 2307 and 2308 are coupled to a constant current source through variable resistors 2309 and 2310, respectively. In one embodiment, the constant current source generates a current of 180 micro amperes (uA). The 180 uA current source is also coupled to the transistors 2303 and 2306.

For the embodiment shown in FIG. 23, the band pass filter 246 is implemented with capacitors 2321, 2322, and 2324, variable resistors 2329 and 2330, and transistors 2323, 2325, 2326, 2327, and 2328. The capacitor 2321 is coupled to the base of BJT transistor 2308 of the image notch filter 244. As shown in FIG. 23, the capacitor 2321 is also coupled to the transistors 2323 and 2327, and the capacitor 2322 is coupled to the transistors 2325 and 2328 and capacitor 2324. In one embodiment, the capacitor 2321 has a value of 0.2×14 pF (i.e., C11=14 pF), the capacitor 2322 has a value of 14 pF (i.e., C22=14 pF), and the capacitor 2324 has a value of 0.8×C11 pF. In one embodiment, the variable resistors 2329 and 2330 have a resistance of 5.5 k Ohms. In one embodiment, the transistors comprise bipolar transistors. As shown in FIG. 23, the emitter of BJT transistors 2327 and 2328 are coupled to a constant current source through variable resistors 2329 and 2330, respectively. In one embodiment, the constant current source generates a current of 180 micro amperes (uA). The 180 uA current source is also coupled to the transistors 2323 and 2326.

Figure 24:
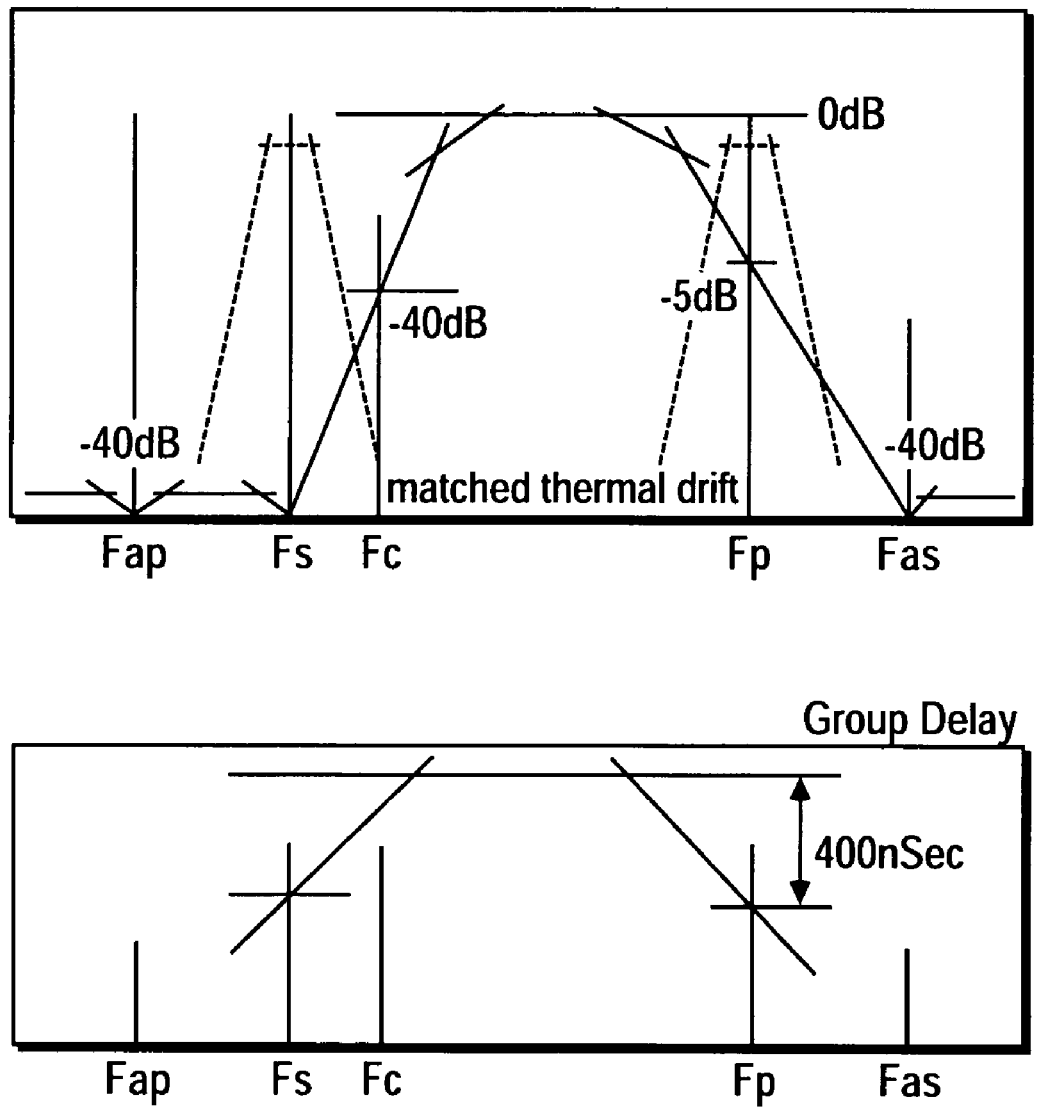
FIG. 24 illustrates a waveform for the SAWF function, including a frequency response and a phase response, realized in silicon.

FIG. 24 illustrates a waveform for the SAWF function, including a frequency response and a phase response, realized in silicon.

Although the present invention has been described in terms of specific exemplary embodiments, it will be appreciated that various modifications and alterations might be made by those skilled in the art without departing from the spirit and scope of the invention.

What is claimed is:

1. A circuit for tuning a television channel comprising:
a plurality of filters, implemented in silicon, for receiving a television signal comprising a plurality of television channels, wherein a television channel comprises a picture carrier ($F_p$), a sound carrier ($F_s$) and a color sub-carrier ($F_{sc}$) signals for tuning a television channel, and for attenuating frequencies out of band of said television channel;
in-phase—quadrature phase ("I, Q") demodulation circuit, coupled to receive a filtered television signal from said filters and for generating a baseband television signal; and
post Nyquist filter, coupled to receive said baseband television signal from said I, Q demodulation circuit and for rejecting signals in adjacent channels, to generate a Nyquist slope, and for extracting a picture signal content from said picture carrier ($F_p$) and color sub-carrier ($F_{sc}$) signals and a sound signal content from said sound carrier ($F_s$) signal.

2. The circuit as set forth in claim 1, wherein said post Nyquist filter comprises a biquadratic filter.

3. The circuit as set forth in claim 1, wherein said post Nyquist filter comprises a transfer function defined as:

$$A = \frac{(1 + Za)x(1 + Zb)x(1 + Zc)}{(1 + Sa)x(1 + Sb)x(1 + Sc)} \text{ wherein,}$$

$$Sa = jxZa = jx\frac{W}{Wa}$$

$$Sb = jxZb = jx\frac{W}{Wb}$$

$$Sc = jXZc = jx\frac{W}{Wc}.$$

4. The circuit as set forth in claim 1, wherein said filters comprise bandpass filters to extract picture signal content and sound signal content from said television signal.

5. The circuit as set forth in claim 1, wherein said filters comprise notch filters to attenuate adjacent channels in said television signal.

6. The circuit as set forth in claim 1, wherein said filters comprise biquadratic transconductance filters.

7. The circuit as set forth in claim 1, further comprising a downconverter circuit for converting said television signal from a radio frequency ("RF") television signal to an intermediate frequency ("IF") television signal.

8. The circuit as set forth in claim 7, wherein said I, Q demodulation circuit further for locking a carrier frequency of said television signal channel for downconverting said television signal from said IF television signal to said baseband video signal.

9. A television receiver comprising:
downconverter circuit for receiving a television signal comprising a plurality of television channels, wherein a television channel comprises a picture carrier ($F_p$), a sound carrier ($F_s$) and a color sub-carrier ($F_{sc}$) signals and converting said television signal from a radio frequency ("RF") television signal to an intermediate frequency ("IF") television signal;
a plurality of filters, implemented in silicon, for receiving said IF television signal for tuning a television channel, and for attenuating frequencies out of band of said television channel;
in—phase-quadrature phase ("I, Q") demodulation circuit, coupled to receive a filtered IF analog television signal from said filters, for downconverting said television signal from said IF analog television signal to baseband and for generating a baseband television signal; and
post Nyquist filter, coupled to receive said baseband television signal from said I, Q demodulation circuit and for rejecting signals in adjacent channels, to generate a Nyquist slope, and for extracting a picture signal content from said picture carrier ($F_p$) and color sub-carrier ($F_{sc}$) signals and a sound signal content from said sound carrier ($F_s$) signal.

10. The television receiver as set forth in claim 9, wherein said post Nyquist filter comprises a biquadratic filter.

11. The television receiver as set forth in claim 9, wherein said post Nyquist filter comprises a transfer function defined as:

$$A = \frac{(1 + Za)x(1 + Zb)x(1 + Zc)}{(1 + Sa)x(1 + Sb)x(1 + Sc)} \text{ wherein,}$$

$$Sa = jxZa = jx\frac{W}{Wa}$$

$$Sb = jxZb = jx\frac{W}{Wb}$$

$$Sc = jXZc = jx\frac{W}{Wc}.$$

12. The television receiver as set forth in claim 9, wherein said filters comprise bandpass filters to extract picture signal content and sound signal content from said television signal.

13. The television receiver as set forth in claim 9, wherein said filters comprise notch filters to attenuate adjacent channels in said television signal.

14. The television receiver as set forth in claim 9, wherein said filters comprise biquadratic transconductance filters.

15. A method for processing a television signal, said method comprising:

receiving said television signal for tuning a channel, said television signal comprising a plurality of television channels, wherein a television channel comprises a picture carrier ($F_p$), a sound carrier ($F_s$) and a color sub-carrier ($F_{sc}$) signals;

downconverting said television signal from a radio frequency ("RF") signal to an intermediate frequency ("IF") signal;

determining a channel for tuning;

attenuating frequencies of said IF signal out of band of said channel;

receiving said IF signal for in-phase quadrature phase ("I, Q") demodulation;

downconverting said IF signal in said I, Q demodulation;

generating a baseband television signal in said I, Q demodulation; and filtering, in a post Nyquist filter, said baseband television signal by rejecting signals in adjacent channels, to generate a Nyquist slope, and by extracting a picture signal content from said picture carrier ($F_p$) and color sub-carrier ($F_{sc}$) signals and a sound signal content from said sound carrier ($F_s$) signal.

* * * * *